(12) United States Patent
Ma

(10) Patent No.: US 7,080,986 B2
(45) Date of Patent: Jul. 25, 2006

(54) PICK UP CAP FOR CARRYING IC SOCKET

(75) Inventor: Hao-Yun Ma, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/994,052

(22) Filed: Nov. 19, 2004

(65) Prior Publication Data

US 2005/0176280 A1 Aug. 11, 2005

(30) Foreign Application Priority Data

Nov. 21, 2003 (TW) .............................. 92220595 U

(51) Int. Cl.
*H01R 13/60* (2006.01)
(52) U.S. Cl. ...................................................... 439/41
(58) Field of Classification Search ................ 439/135, 439/342, 33, 940, 41, 901, 892, 73
See application file for complete search history.

(56) References Cited

U.S. PATENT DOCUMENTS

| | | | | |
|---|---|---|---|---|
| 5,055,971 A | * | 10/1991 | Fudala et al. ................ 361/760 |
| 5,899,760 A | * | 5/1999 | Ho et al. ...................... 439/135 |
| 6,019,617 A | * | 2/2000 | Liu et al. ..................... 439/135 |
| 6,116,949 A | * | 9/2000 | Costello et al. ............. 439/509 |
| 6,439,901 B1 | * | 8/2002 | Ji et al. ........................ 439/135 |
| 6,561,825 B1 | * | 5/2003 | McHugh et al. ............. 439/135 |
| 6,655,970 B1 | * | 12/2003 | Tsai ............................. 439/135 |
| 6,877,990 B1 | * | 4/2005 | Liao et al. ..................... 439/41 |
| 6,899,553 B1 | * | 5/2005 | Ma et al. ...................... 439/135 |
| 6,905,353 B1 | * | 6/2005 | Ma et al. ...................... 439/135 |
| 6,908,327 B1 | * | 6/2005 | Ma ............................... 439/331 |

* cited by examiner

*Primary Examiner*—Tulsidas C. Patel
*Assistant Examiner*—Harshad C Patel
(74) *Attorney, Agent, or Firm*—Wei Te Chung

(57) ABSTRACT

A pick up cap (40) for carrying an LGA socket (30) is disclosed according to the present invention. The pick up cap has a major body (42) with a pair of ears (44) at opposite sides of the body. The body defines a smooth top surface (422) for being sucked by a vacuum sucking device, and a number of latches (426, 423) for detachably holding on the LGA socket. The body is formed with a number of slant faces (462, 482) to contiguously mate with slant surfaces defined on a clip (80) of the LGA socket. The mating is arranged adjacent two opposite ends of each of opposite sides (864, 866) of the clip, thereby balancing the pick up cap when the pick up cap mounted on the clip of the LGA socket is acted on by uneven exterior forces.

9 Claims, 4 Drawing Sheets

PICK UP CAP FOR CARRYING IC SOCKET

BACKGROUND OF THE INVENTION

1. Field of the Invention

The present invention relates to the art of electrical connectors and, more specifically to a pick up cap for mechanically carrying an electrical connector, e.g. an integral circuit (IC) socket, on an electrical substrate, e.g. a printed circuit board (PCB).

2. Description of the Prior Art

With the development of the connector industry toward the miniaturized, high-density and more reliable trends, generally, terminals or contacts secured on dielectric housings of connectors, especially certain connectors used for electrically interconnecting an IC package, especially an land grid array (LGA) package with high-density leads or pads thereon with a PCB, are configured to be tiny and arranged in a high-density manner, e.g. a rectangular array, to catch up with the trends. This typically leads a problem, e.g. how to accurately position such a tiny and high-density connector on a PCB.

To resolve the above problem, a pick up cap is generally provided to carry an electrical connector and accurately place the electrical connector on a predetermined real estate of a corresponding PCB.

FIG. 8 illustrates that a pick up cap 94 is provided to carry an LGA socket 92. The LGA socket 92 comprises a base 920, terminals planted on the base 920, a lever 923 and a clip 922 pivotally attached to opposite sides of the base 920. The clip 922 has a pair of first sides and a pair of second sides 9220. The first sides and second sides cooperatively define a window 9220 to facilitate assembling the pick up cap 94 on the clip 922.

The pick up cap 94 has a plate-like body 942 and a pair of ears 944 integrally and coplanarly extended from middles of opposite sides of the body 942, respectively. A major and smooth surface 9420 is formed on a top of the body 942, for being sucked by a vacuum-sucking device (not shown). A pair of latches 9422 is firmly formed at another side of the body 942, extending away from the surface 9420. Another pair of resilient hooks 9424 formed a side opposing to said another side, extending away from the surface 9420. The latches 9422 and the hooks 9424 respectively inferentially hold corresponding inner sides of the window 9222 of the clip 922, thereby attaching the pick up cap 94 to the LGA socket 92.

Referring also to FIG. 9, after assembling of the pick up cap 94 on the LGA socket 92, the body 942 falls into the window 9222, with the ears 944 thereof mounting on corresponding second sides 9220 of the clip 922.

With this configuration, as often happens in the real work, when first and second ends of the pick up cap 94 are respectively pressed downwardly by a pair of uneven forces, e.g. F1 being larger than F2 to the extend that a gap therebetween can overcome inferential force between the hooks 9424 and corresponding inner sides of the window 9222, the body 942 of the pick up cap 94 may be turned over around the ears 944, with the first end thereof diving into the window 9222. If this happens, the first end of body 942 may hammer parts of the terminals which are exposed above a top of the base 920, and deform the terminals. As a result, the LGA socket 92 may be wastage.

In view of the above, it is strongly desired to provide a pick up cap which overcomes the above-mentioned disadvantages.

SUMMARY OF THE INVENTION

Accordingly, an object of the present invention is to provide a new pick up cap for an electrical connector, wherein the pick up cap can prevent the pick up cap from turning over on the electrical connector when uneven forces are acted thereon.

To fulfill the above-mentioned object, a new pick up cap for an electrical connector is provided according to the present invention. The electrical connector comprises a base, terminals planted on the base, a clip and a lever pivotally attached to opposite sides of the base. The clip has a pair of first sides and a pair of second sides, the first and second sides cooperatively defining a window. Each second side comprises a middle part and first and second slant portions extending from opposite ends of the middle part. The pick up cap has major body with a pair of ears provided at opposite sides of the body. Latches are provided at another opposite sides of the body to mechanically engage corresponding inner sides of the window, for detachably mounting the pick up cap on the clip. First and second extending sections are provided at opposite sides of each ear, the first extending section having a first slant surface contiguously mated with the first slant portion and the second extending section having a second slant surface contiguously mated with the second slant portion.

With this configuration of the pick up cap, even uneven forces are pressed downwardly on the body, mating of the first and second slant surfaces with corresponding first and second slant portions can bear the uneven force and make the pick up cap steadily attach on the electrical connector.

Other objects, advantages and novel features of the present invention will become more apparent from the following detailed description when taken in conjunction with the accompanying drawings.

BRIEF DESCRIPTION OF THE DRAWINGS

The features of the present invention which are believed to be novel are set forth with particularity in the appended claims. The invention, together with its objects and the advantages thereof, may be best understood by reference to the following detailed description taken in conjunction with the accompanying drawings, in which like reference numerals identify like elements, and in which:

DESCRIPTION OF PREFERRED EMBODIMENTS OF THE INVENTION

Reference will now be made to the drawings to describe the present invention in detail.

Figure 1:
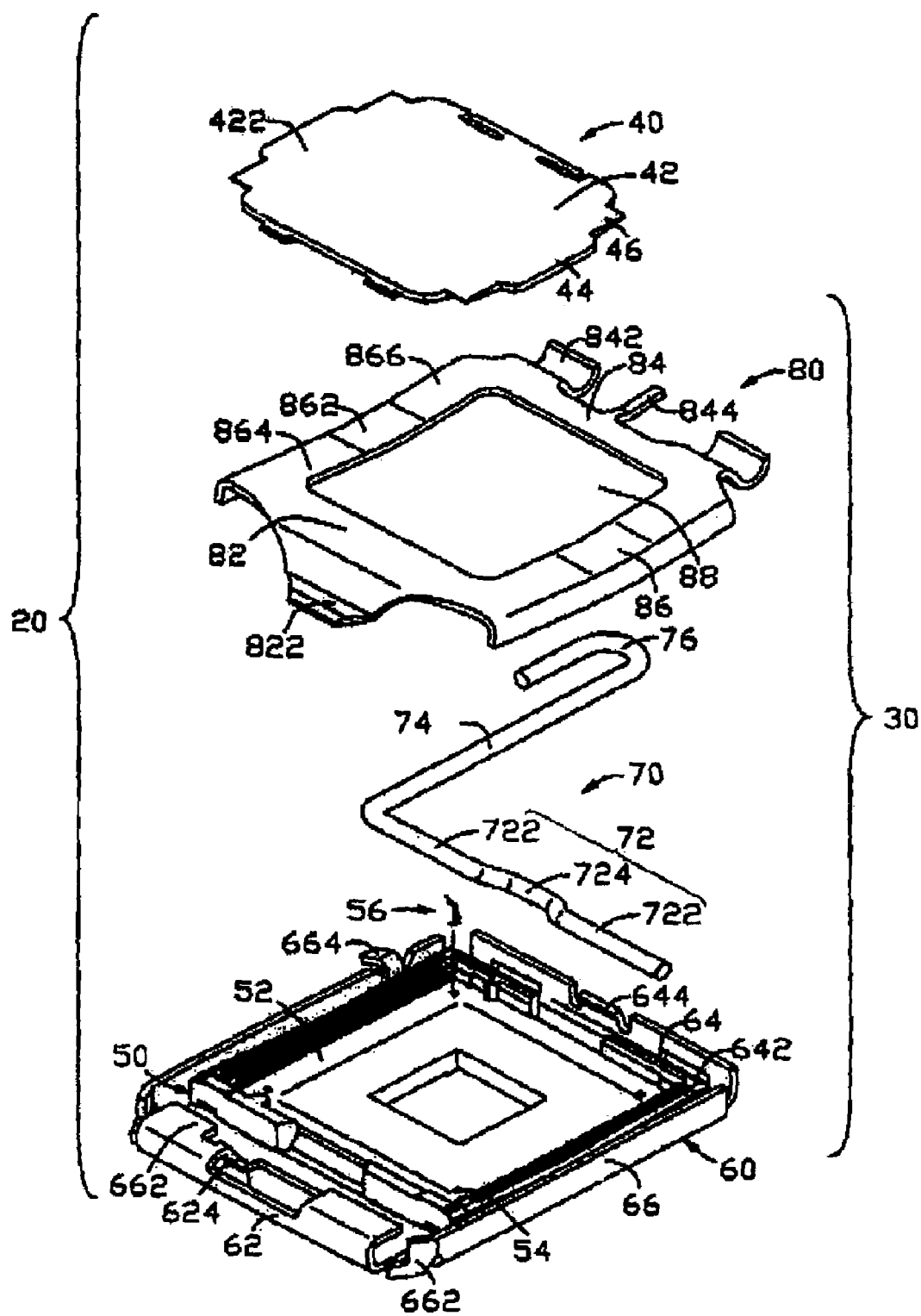
FIG. 1 is an exposed, isometric view of a pick up cap and an LGA socket on which the pick up cap is to be attached.

Referring to FIG. 1, a pick up cap 40 according to a preferred embodiment of the present invention is adapted to carry an LGA socket 30. It is appreciated that the pick up cap 40 can be used to carry other device, depending on the specific case.

In the preferred embodiment, the LGA socket 30 comprises a base 300 and a lever 70 and a clip 80 pivotally attached to opposite sides of the base 300. The base 300 includes a dielectric housing 50 and a metal reinforcing member 60 harnessing the housing 50. A plurality of terminals 56 is planted on the housing 50, each terminal 56 having a top part exposed outside the housing 50.

The reinforcing member 60 has first, second, third and fourth sides 62, 64, 66 and 68 around the housing 50. The first side 62 defines a pair of rectangular holes 620 at opposite sides thereof and forms a stopping tail 622 between the rectangular holes 620.

A bent mounting part 662 is formed at a free end of each of the third and fourth sides 66 and 68, standing away from the first side 62. A stopper 664 is formed near an end of the third side 66, standing close the first side 62.

A pair of horizontal wings 642 extends inwardly from a top of the second side 64, parallel to a bottom of the reinforcing member 60. A positioning tab 644 is formed between the wings 642.

The lever 70 comprises a shaft 72 and a handle 74 extending perpendicularly from an end of the shaft 72. The shaft 72 is formed with an offset pressing portion 724 at a middle thereof, and a pair of positioning sections 722. A curved part 76 is formed a distal end of the handle 74, for facilitating handling by a user.

The clip 80 has a substantially rectangular configuration with a pair of first sides 82 and 84 and a pair of second sides 86. The first and second sides cooperatively defines a substantially rectangular window 88.

In the preferred embodiment, the first sides are rear and front sides 84 and 82. A pair of curved hooks 842 is formed a rear edge of the rear side 84, corresponding the rectangular holes 620 of the reinforcing member 60. A rearwardly extending portion 844 is formed between the curved hooks 842, corresponding the stopping tail 622. An engaging portion 822 extends downwardly from a front edge of the front side 82 of the clip 80, for engaging with the offset pressing portion 724.

Figure 2:
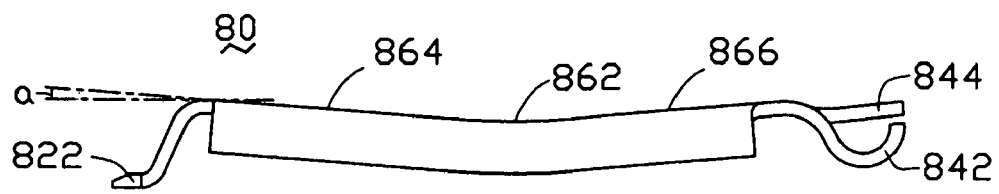
FIG. 2 is a side view of a clip of the LGA socket of FIG. 1.

Each second side 86 comprises a flat middle part 862 and first and second slant portions 864 and 866 extending upwardly and slantwise at the same angle "a" with respect to the middle part 862 (best seen in FIG. 2). In the preferred embodiment, the first and second slant portions 864 and 866 symmetrically extend from opposite sides of the middle part 862. It is appreciated that the first and second slant portions 864 and 866 can extend at different angles relative to the middle part 862.

Figure 3:
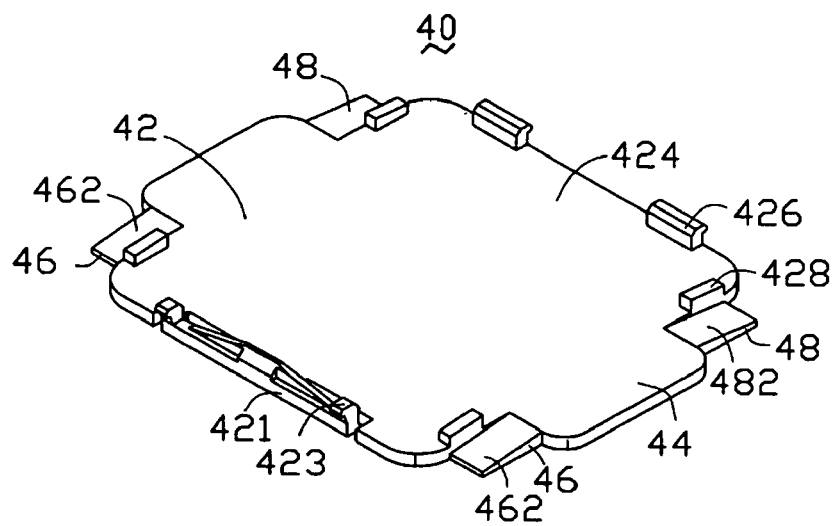
FIG. 3 is a reversed, isometric view of the pick up cap of FIG. 1.
Figure 4:
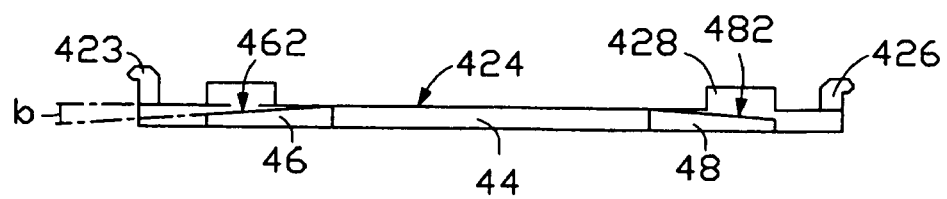
FIG. 4 is a side view of the pick up cap of FIG. 3.

Referring also to FIGS. 3 and 4, the pick up cap 40 has a plate-like body 42 shaped to be fit to the window 88 of the clip 80. A pair of ears 44 extends coplanarly and integrally from middles of opposite edges of the body 42, for mounting on corresponding second sides 86 of the clip 80. The body 42 is formed with a smooth major top surface 422 for being sucked by a vacuum device (not shown), and a bottom surface 424 opposing to the top surface 422.

A pair of first latches 426 extends from the bottom surface 424 away from the top surface 422, standing close one edge of the body 42. A pair of resilient second latches 423 is formed on an opposite edge of the body 42, extending away from the top surface 422. Each second latch 423 is connected with the body 42 by a cantilever arm 421, thereby making the second latch 423 more resilient. Further, four position blocks 428 are interspersed on the bottom surface 424 around edges of the bottom surface 424.

First and second supporting members 46 and 48 symmetrically extend from opposite sides of each ear 44 away from each other. The first and second supporting members 46 and 48 are integrally connected with the body 42, and are formed with first and second slant surfaces 462 and 482. The first and second slant surfaces 462 and 482 each form the same angle "b" with respect to the bottom surface 424 or the top surface 422. The angle "b" is equal to the angle "a". It is appreciated that the first and second slant surfaces 462 and 482 can form different angles with respect to the bottom surface 424 or the top surface 422, provided that the different angles of the first second slant surface 462 and 482 relative to the bottom surface 424 or the top surface 422 respectively correspond to the different angles of the first and second slant portions 864 and 866 with respect to the middle part 862.

Figure 7:
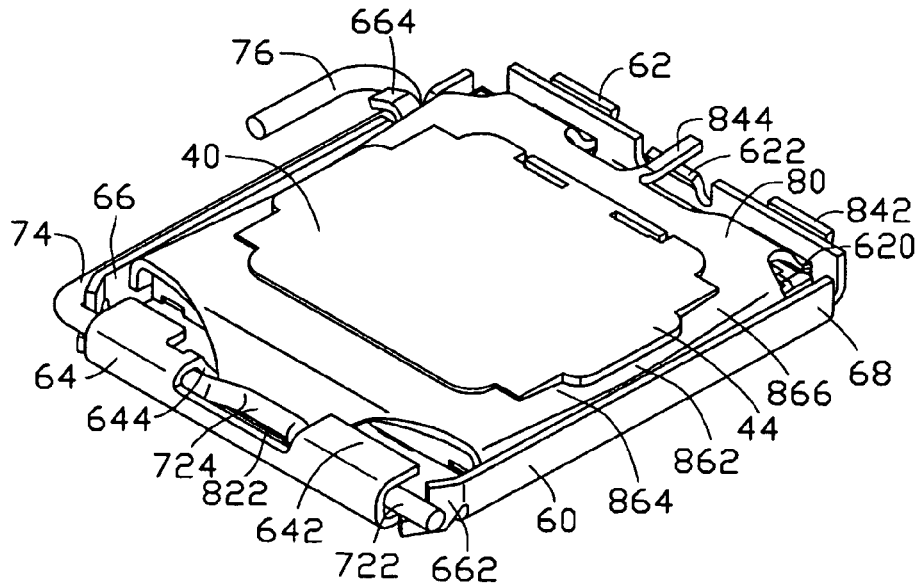
FIG. 7 is an isometric view of the pick up cap being mounted on the LGA socket.
Figure 8:
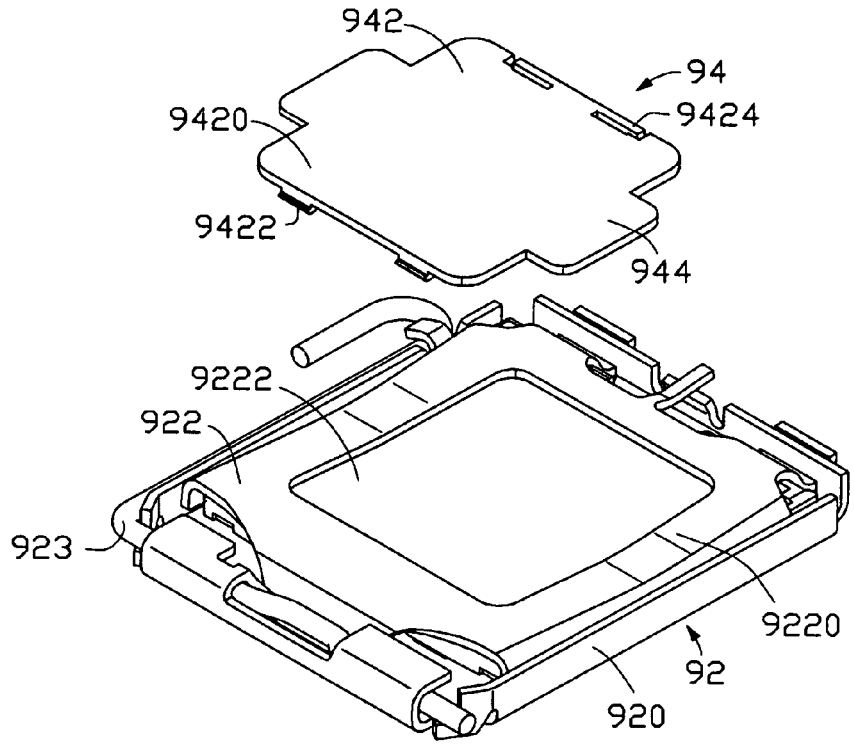
FIG. 8 is an isometric view of a conventional LGA socket and a conventional pick up cap ready to be mounted on the conventional LGA socket.
Figure 9:
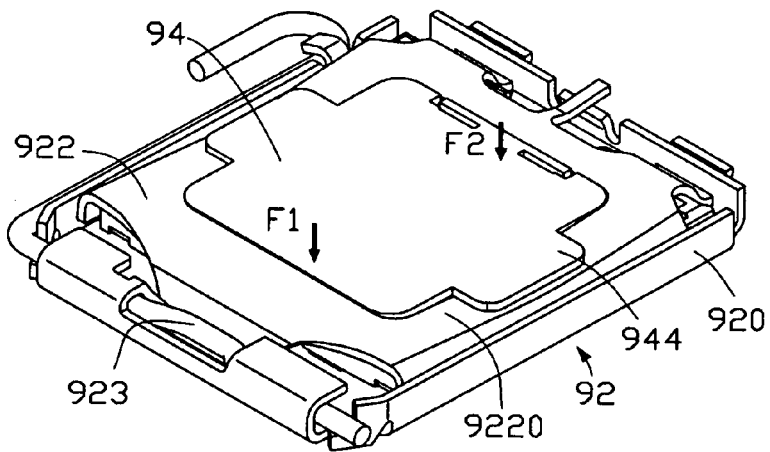
FIG. 9 is similar to FIG. 8, but showing the conventional pick up cap mounted on the LGA socket.

Referring to FIGS. 1 and 7, in assembly, the curved hooks 842 are respectively inserted into the holes 620 of the reinforcing member 60, thereby assuring pivotal engagement between the clip 80 and the reinforcing member 60. Further, the stopping tail 622 mates with the extending portion 844 so as to prevent the clip 80 from escaping from the first side 62 of the reinforcing member 60 and over-rotating.

The shaft 72 is placed between the wings 642 and the bottom of the reinforcing member 60, the positioning sections 722 thereof being mounted on corresponding bent mounting part 662. The positioning tab 644 is bent to hold the shaft 72 on the second side 64 of the reinforcing member 60, thereby pivotally attaching the lever 70 on the reinforcing member 60.

In use, when an IC package (not shown) is placed on the housing 50. The clip 80 is rotated to press the IC package on the terminals 56. In order to fix the clip 80, the curved part 76 of the handle 74 is urged to be held by the stopper 664, the offset pressing portion 724 holding the engaging portion 822. As a result, the IC package is firmly secured on the LGA socket 30, with electrical engagement between the IC package and the terminals 56.

Figure 5:
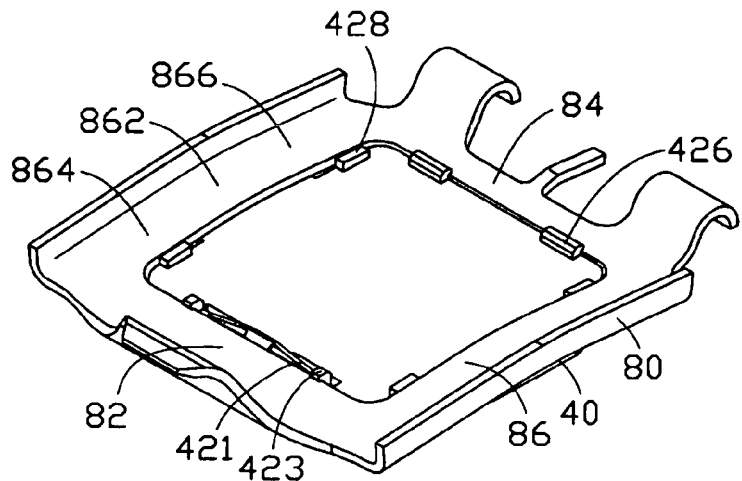
FIG. 5 is an isometric view of the pick up cap mating with the clip.
Figure 6:
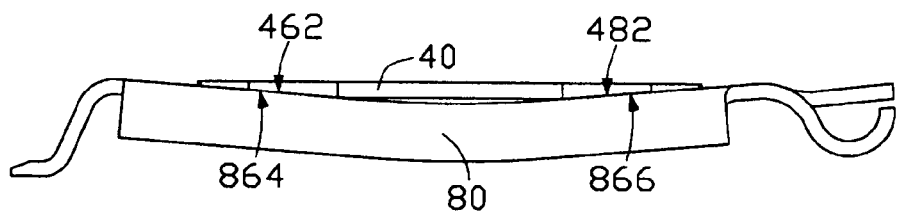
FIG. 6 is a reversed, side view of the pick up cap mating with the clip of FIG. 5.

Referring also to FIGS. 5 and 6, in carrying, the pick up cap 40 is placed downwardly to be accurately mounted on the clip 80, with guidance of the position blocks 428 of the clip 80. Meanwhile, the first latches 426 are pressed to inferentially slide over corresponding inner side of the window 88 and hold a bottom surface of the clip 80, and the second latches 423 are also pressed to resilient deform the cantilever arms 421 to let the second latches 423 inferentially slide over corresponding inner side of the window 88 till they hold the bottom surface of the clip. Further, the ears 44 of the pick up cap 40 abut against corresponding the middle parts 862 of the second sides 86 of the clip 80. As a result, the pick up cap 40 is detachably and firmly secured on the clip 80.

Furthermore, the first and second supporting members 46 and 48 are provided on the opposite sides of each ear 44, extending away from each other. Additionally, the first and second supporting members 46 and 48 are integrally connected with the body 42, and are formed with the first and second slant surfaces 462 and 482. The first and second slant surfaces 462 and 482 each form the same angle "b" with respect to the bottom surface 424 or the top surface 422. The angle "b" is equal to the angle "a".

When the pick up cap 40 is firmly secured on the clip 80, the first and second slant surfaces 462 and 482 respectively contiguously abut against corresponding first and second slant portions 864 and 866 of the clip 80. With this configuration, when the pick up cap 40 is pressed by uneven exterior forces, the first and second slant surfaces 462 and 482 respectively contiguously abut against the corresponding first and second slant portions 864 and 866 of the clip 80 to withhold the unbalance brought by the uneven exterior forces, thereby assuring steady attachment of the pick up cap 40 on the LGA socket 30.

Furthermore, although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical assembly comprising:
    an electrical connector comprising a base, a plurality of terminals planted on the base, a clip pivotally mounted on one side of the base and a lever pivotally attached to an opposite side of the base and being adapted to hold the clip on the base, said clip defining a substantially rectangular hole and a pair of sides spanning the hole;
    a pick up cap being detachably mounted on the electrical connector, and having a substantially rectangular base portion with a smooth top surface and at least one latch for being inserted into the bole and detachably holding on the clip; and
    supporting means being formed around the base portion of the pick up cap and being adapted to contiguously abut against opposite ends of each of the pair of sides so as to keep the pick up cap in a balance status when the pick up cap mounted on the clip is acted on by uneven exterior forces.

2. The electrical assembly as claimed in claim 1, wherein said opposite ends of each of the pair of sides have first and second slant surfaces, respectively, said supporting means is first and second slant faces formed on the pick up cap, corresponding to the first and second slant surfaces.

3. The electrical assembly as claimed in claim 2, wherein the pick up cap defines a connecting portion being integrally connected with the first and second slant faces, said connecting portion extends integrally and coplanarly from the base portion.

4. The electrical assembly as claimed in claim 3, wherein said connecting portion is formed with a top face coplanar with the top surface of the base portion, said first and second slant faces are each slant with respect to the top face of the connecting portion.

5. The electrical assembly as claimed in claim 3, wherein said first and second slant faces are symmetrically defined at opposite sides of the connecting portion.

6. The electrical assembly as claimed in claim 4, wherein first and second extending portions extend from the opposite sides of the connecting portion, respectively, said first and second slant faces are respectively formed on bottoms of the first and second extending portions.

7. The electrical assembly as claimed in claim 6, wherein said first and second extending portions have a common upper surface integrally connected with and coplanar with the top face of the connecting portion.

8. An electrical connector assembly comprising:
    an electrical connector including:
    an insulative housing;
    a plurality of contacts disposed in the housing, each of said contacts defining a surface mounting tail;
    a metallic clip pivotally located upon the housing and defining therein an upward opening with two opposite lengthwise ends thereof in a lengthwise direction;
    a pick up cap mounted upon the clip with a lengthwise dimension similar to that of said opening in the lengthwise direction while with a lateral dimension, around thereof a middle portion, larger than that of the opening in a lateral direction perpendicular to said lengthwise direction so as to form two ears located on two sides thereof in the lateral direction and essentially spaced relatively far from the said two lengthwise ends of the opening, said ears seated upon a middle portion of a lengthwise edge of the clip;
    hook structures formed around two opposite two longwise ends of the pick up cap in said lengthwise direction to engage corresponding opposite lateral edges of the clip at two opposite lengthwise ends of the opening;
    at least one support/stop device formed on a peripheral lengthwise side of said pick up cap and located between one ear and one corresponding lengthwise end of the pick up cap and supportably seated upon the lengthwise edge of the clip for preventing improper downward movement of the pick up cap around said corresponding lengthwise end of the pick up cap when an improper excessive downward forces is imposed upon said corresponding lengthwise end of the pick up cap.

9. The connector assembly as claimed in claim 8, wherein said support/stop device defines a wedge-like configuration to comply with an upward concave structure of the clip.

* * * * *